(12) United States Patent
Tseng et al.

(10) Patent No.: US 10,321,597 B2
(45) Date of Patent: Jun. 11, 2019

(54) USER INTERFACE ENHANCED STORAGE SLED HANDLE WITH EMBEDDED SECURITY FEATURES

(71) Applicant: DELL PRODUCTS, L.P., Round Rock, TX (US)

(72) Inventors: Chun Yang Tseng, Taipei (TW); Yi-Wei Lu, Taipei County (TW); Lawrence A. Kyle, Salado, TX (US)

(73) Assignee: Dell Products, L.P., Round Rock, TX (US)

( * ) Notice: Subject to any disclaimer, the term of this patent is extended or adjusted under 35 U.S.C. 154(b) by 160 days.

(21) Appl. No.: 14/846,971

(22) Filed: Sep. 7, 2015

(65) Prior Publication Data

US 2017/0071071 A1    Mar. 9, 2017

(51) Int. Cl.
*H05K 7/14* (2006.01)

(52) U.S. Cl.
CPC ......... *H05K 7/1411* (2013.01); *H05K 7/1489* (2013.01)

(58) Field of Classification Search
CPC .. H05K 7/1405; H05K 7/1411; H05K 7/1421; H05K 7/1417
USPC ................ 361/752, 679.01, 679.58
See application file for complete search history.

(56) References Cited

U.S. PATENT DOCUMENTS

| | | | | |
|---|---|---|---|---|
| 6,683,785 B1* | 1/2004 | Chen | ................... | G11B 33/124 312/332.1 |
| 6,739,162 B1* | 5/2004 | Kondratuk | ................ | E05B 9/02 292/140 |
| 6,804,111 B1* | 10/2004 | Williams | ............. | G11B 33/125 312/223.1 |
| 6,925,843 B1* | 8/2005 | Pols Sandhu | ........... | E05B 65/46 361/726 |
| 7,511,953 B2* | 3/2009 | Tao | ......................... | G06F 1/187 361/679.39 |
| 7,677,680 B1* | 3/2010 | Chang | ...................... | E05C 1/12 211/26 |
| 8,434,335 B2* | 5/2013 | Roth | ...................... | E05B 47/02 292/244 |
| 8,490,443 B2* | 7/2013 | Gokcebay | .......... | G07C 9/00666 70/214 |
| 8,495,898 B2* | 7/2013 | Gokcebay | .......... | G07C 9/00666 70/214 |
| 9,226,425 B2* | 12/2015 | Hsu | ...................... | H05K 7/1488 |
| 2005/0111178 A1* | 5/2005 | Bradley | ................. | G06F 1/184 361/679.38 |
| 2008/0203736 A1* | 8/2008 | Ramsauer | ................. | E05B 9/08 292/58 |
| 2009/0229323 A1* | 9/2009 | Dykstra | ................ | E05B 13/001 70/158 |
| 2010/0154489 A1* | 6/2010 | Bacon | ....................... | E05B 5/00 70/77 |
| 2011/0016938 A1* | 1/2011 | Chi | ......................... | E05B 41/00 70/432 |

(Continued)

*Primary Examiner* — Rockshana D Chowdhury
(74) *Attorney, Agent, or Firm* — Isidore PLLC (57) ABSTRACT

A latch for securing a compute sled into a chassis is provided. The latch includes a body with a user manipulable control, the body configured for mounting to a drawer of the compute sled, the user manipulable control configured for causing a slider to one of engage and disengage a deadbolt with a complimentary slot of a sleeve for containing the drawer, the latch further configured for engaging a retention element of the chassis.

18 Claims, 10 Drawing Sheets

(56) References Cited

U.S. PATENT DOCUMENTS

2015/0211258 A1* 7/2015 Gokcebay ............... E05B 47/06
70/278.1

* cited by examiner

USER INTERFACE ENHANCED STORAGE SLED HANDLE WITH EMBEDDED SECURITY FEATURES

BACKGROUND

1. Technical Field

The present disclosure generally relates to an information handling system and in particular to a sled secure latch for use within an information handling system.

2. Description of the Related Art

As the value and use of information continue to increase, individuals and businesses seek additional ways to process and store information. One option available to users is information handling systems. An information handling system generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As the demand for computing equipment has grown, so has the need for efficient packaging of the equipment. Generally, high capacity computing systems include a variety of components that are mounted into a sled. The sled is stored within a chassis that is, in turn, disposed within a rack. Generally, use of rack units with configurable chassis has provided users with a great deal of flexibility in configuring and maintaining computing systems.

Unfortunately, with increasing costs, there is a need to be able to quickly reconfigure components within a chassis. That is, in order to make the most of available resources it is desirable to have systems that permit users to quickly remove sleds from chassis, thus permitting quick user access to components therein. Preferably, the methods and apparatus provide for consumption of very little space, and limit accidental removal from a chassis.

BRIEF SUMMARY

In one embodiment, a latch for securing a compute sled into a chassis is provided. The latch includes a body with a user manipulable control, the body configured for mounting to a drawer of the compute sled, the user manipulable control configured for causing a slider to one of engage and disengage a deadbolt with a complimentary slot of a sleeve for containing the drawer, the latch further configured for engaging a retention element of the chassis.

The user manipulable control may include a button-like structure including an engagement feature for engaging a user defined tool, and the button-like structure may include a security button including a cross-slot pattern. The cross-slot pattern may be configured to indicate one of a locked and an unlocked status. The latch may include a pull handle that is attached to the body. The lock or unlocked indication may be provided in combination with a pull handle that is attached to the body. The pull handle may be configured to disengage an engagement element of the compute sled from a retention element of the chassis. A spring for biasing the pull handle into a closed position may be included. The latch may include a clip configured to provide friction between the slider and the body. The latch may include a cam disk configured to adjust the slider upwardly and downwardly according to rotation of the user manipulable control. The chassis may be part of a rack unit. The rack unit may be configured for mounting in a storage rack.

In another embodiment, a method for assembling a latch for securing a compute sled into a chassis is provided. The method includes selecting a body for maintaining a user manipulable control, the body configured for mounting to a drawer of the compute sled, the user manipulable control configured for causing a slider to one of engage and disengage a deadbolt with a complimentary slot of a sleeve for containing the drawer, the latch further configured for engaging a retention element of the chassis. The method may further include installing the user manipulable control and the slider within the body.

The method may include incorporating a cam disk against the backside of the slider.

The method may include mounting a pull handle to the body with a pin and may further include incorporating a spring configured to bias the pull handle into a closed position. The method may include incorporating a clip configured for causing friction between the slider and the body. The method may include securing the user manipulable control and the slider with a screw.

In yet another embodiment, a method for removing a compute sled from the chassis of a rack unit is provided. The method includes: operating a user manipulable control of a latch for securing a compute sled into a chassis, the latch including a body with the user manipulable control, the control configured for causing a slider to one of engage and disengage a deadbolt with a complimentary slot of the chassis.

The method may further include manipulating a pull handle and may also include at least one of causing an engagement element of the compute sled to disengage from a retention element of the chassis, and pulling the compute sled from the chassis.

In another embodiment, an information handling system (IHS) is provided. The IHS includes a compute sled configured for mounting within a chassis of a rack unit, the sled including at least one component of the IHS disposed therein; and a latch for securing the compute sled into the chassis, the latch comprising a body with a user manipulable control, the body configured for mounting to a drawer of the compute sled, the user manipulable control configured for causing a slider to engage and disengage a deadbolt with a complimentary slot of a sleeve for containing the drawer, the latch further configured for engaging a retention element of the chassis.

The information handling system (IHS) may include any instrumentality or aggregate of instrumentalities operable to compute, classify, process, transmit, receive, retrieve, originate, switch, store, display, manifest, detect, record, reproduce, handle, or utilize any form of data.

The above presents a general summary of several aspects of the disclosure in order to provide a basic understanding of at least some aspects of the disclosure. The above summary contains simplifications, generalizations and omissions of detail and is not intended as a comprehensive description of the claimed subject matter but, rather, is intended to provide a brief overview of some of the functionality associated therewith. The summary is not intended to delineate the scope of the claims, and the summary merely presents some concepts of the disclosure in a general form as a prelude to the more detailed description that follows. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

The illustrative embodiments provide a sled secure latch configured for securing a sled containing information handling system components within the chassis of a rack unit.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments. The term "exemplary" is not to be construed as a superlative, but merely as referring to one example of many.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

Figure 1:
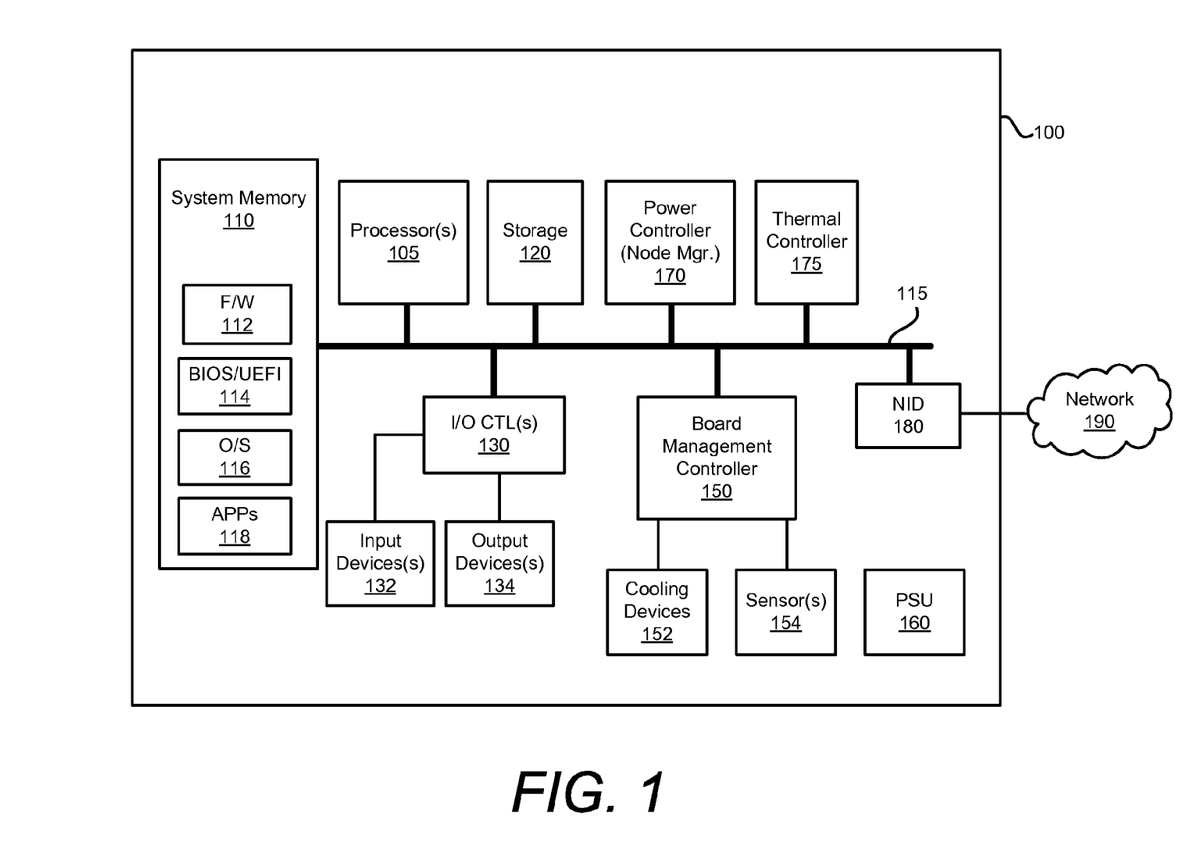
FIG. 1 illustrates an example information handling system within which various aspects of the disclosure can be implemented, according to one or more embodiments.

FIG. 1 illustrates a block diagram representation of an example information handling system (IHS) 100, within which one or more of the described features of the various embodiments of the disclosure can be implemented. For purposes of this disclosure, an information handling system 100, may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a handheld device, personal computer, a server, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system 100 may include one or more disk drives, one or more network ports for communicating with external devices as well as various input and output (I/O) devices, such as a keyboard, a mouse, and a video display. The information handling system may also include one or more buses operable to transmit communications between the various hardware components.

Referring specifically to FIG. 1, an example of the IHS 100 is provided. In this example, the IHS 100 includes one or more processor(s) 105 coupled to system memory 110 via system interconnect 115. The one or more processor(s) 105 may also be referred to as a "central processing unit" (CPU) 105. System interconnect 115 can be interchangeably referred to as a "system bus" 115, in one or more embodiments. Also coupled to system interconnect 115 is storage 120 within which can be stored one or more software and/or firmware modules and/or data (not specifically shown). In one embodiment, storage 120 can be a hard drive or a solid state drive. The one or more software and/or firmware modules within storage 120 can be loaded into system memory 110 during operation of IHS 100. As shown, system memory 110 can include therein a plurality of software and/or firmware modules including application(s) 112, operating system (O/S) 114, basic input/output system/unified extensible firmware interface (BIOS/UEFI) 116 and firmware (F/W) 118. The various software and/or firmware modules have varying functionality when their corresponding program code is executed by one or more processors 105 or other processing devices within IHS 100. During boot-up or booting operations of IHS 100, processor 105 selectively loads at least BIOS/UEFI driver or image from non-volatile random access memory (NVRAM) to system memory 110 for storage in BIOS/UEFI 116. In one or more embodiments, BIOS/UEFI image comprises the additional functionality associated with unified extensible firmware interface and can include UEFI images and drivers.

IHS 100 further includes one or more input/output (I/O) controllers 130 which support connection by, and processing of signals from, one or more connected input device(s) 132, such as a keyboard, mouse, touch screen, or microphone. I/O controllers 130 also support connection to, and forwarding, of output signals to one or more connected output devices 134, such as a monitor or display device or audio speaker(s).

IHS 100 further includes a baseboard management controller (BMC) 150. The BMC 150 is in communication with, and control of, one or more cooling device 152, and at least one sensor 154. At least one power supply unit 160 is included in the IHS 100.

IHS 100 further includes a network interface device (NID) 180. NID 180 enables IHS 100 to communicate and/or interface with other devices, services, and components that are located external to IHS 100. These devices, services, and components can interface with IHS 100 via an external network, such as exemplary network 190, using one or more communication protocols. In one embodiment, a customer provisioned system/platform may include multiple devices located across a distributed network, and NID 180 enables IHS 100 to be connected to these other devices. Network 190 can be a local area network, wide area network, personal area network, and the like, and the connection to and/or between network and IHS 100 can be wired or wireless or a combination thereof. For purposes of discussion, network 190 is indicated as a single collective component for simplicity. However, it is appreciated that network 190 can include one or more direct connections to other devices as well as a more complex set of interconnections as can exist within a wide area network, such as the Internet.

As discussed herein, and for purposes of clarity, the IHS 100 includes a plurality of "computing resources" and may include system cooling. Generally, the computing resources provide system functionality needed for computing functions. Exemplary computing resources include, without limitation, processor 105, memory 110, storage 120, and the input/output controller 130, and other such components. Generally, the system cooling provides for cooling of the computing resources. Exemplary system cooling components include the one or more cooling device 152, and may include at least one fan.

Figure 2:
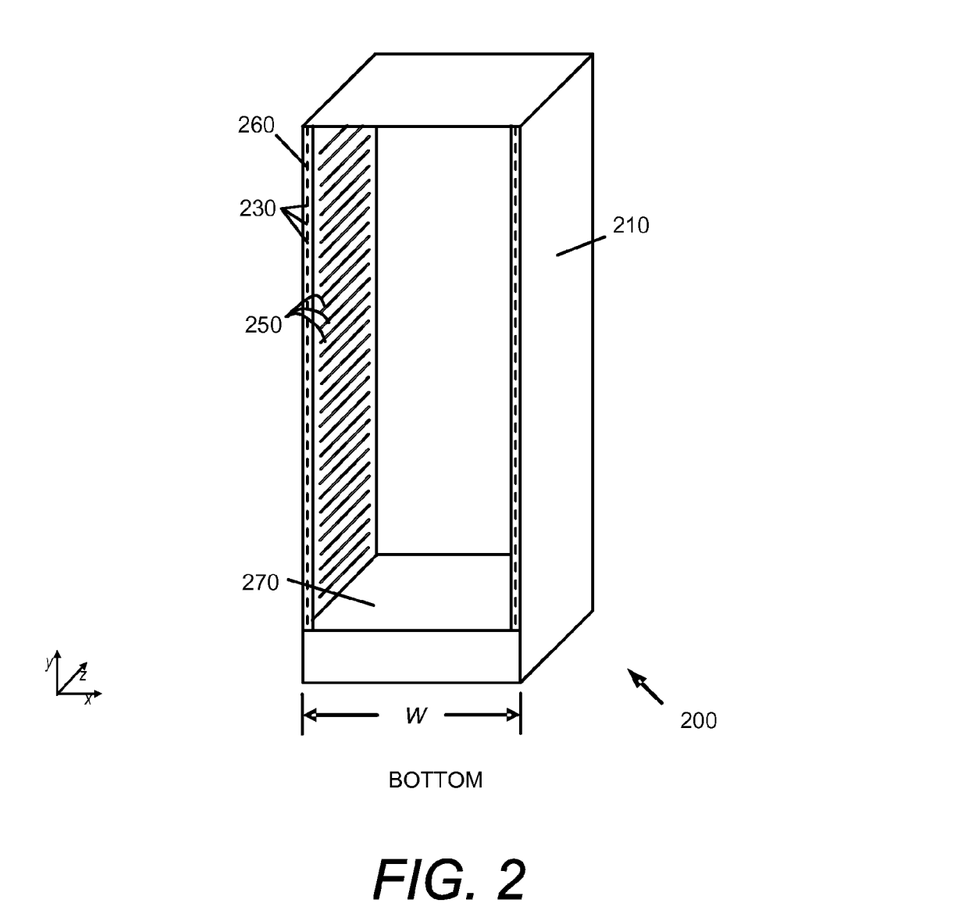
FIG. 2 is a perspective diagram depicting a rack used for storing a plurality of rack units.

With reference now to FIG. 2, there is shown an exemplary rack 200. The rack 200 generally includes a housing 210 that provides an enclosure for a plurality of sleds containing functional components of an IHS 100, such as a server. Generally, the rack 200 includes a base 270. The housing 210 includes a left side and a right side. Disposed on an inner surface of each of the left side and the right side are a plurality of rails 250. Each of the rails 250 provides for receiving a complimentary drawer slide that is mounted onto each of the various rack units. Accordingly, each of the rack units may be slid into or out of the housing 210. Generally, the rack 200 includes a post 260 disposed on each of a left side and a right side of the housing 210. Disposed within each post 260 is a plurality of holes 230. In some embodiments, the holes 230 are threaded. The holes 230 have a distribution along the length of the post 260 that correlates to fasteners of respective rack units. (See FIG. 3).

As discussed throughout herein, terms of orientation are not limiting. However, for purposes of convention, it may be considered that the various components exhibit dimensional characteristics consistent with the orientations described for the rack 200. That is, as shown in FIG. 2, the rack 200 has a width, W. The width of each rack unit that is stored within the rack 200 is along the same axis (shown as the X-axis). Similarly, the height of each rack unit should be considered in respect to the Y-axis of the rack 200, and the depth of each rack unit should be considered in respect to the Z-axis of the rack 200.

In some embodiments, distribution of the holes 230 is provided according to industry standards. Accordingly, a variety of rack units may be used within the rack 200. In order to provide for standardization, common dimensions for the rack 200 are used. In common embodiments, the rack 200 is either 19 inches wide or 23 inches wide. The 19-inch (482.6 mm) or 23-inch (584.2 mm) dimension reflects the width of the equipment mounting-frame in the rack 200 including the frame; the width of the equipment that can be mounted inside the rack 200 is less.

Spacing of the holes 230 within the plurality of holes 230 is either on 1-inch (25 mm) (Western Electric standard), 0.625 inches (or 15.9 millimeters spacing), used for 19-inch (480 mm) racks. Another name for this type of rack is "ETSI rack," which is described in standards promulgated by the European Telecoms Standards Institute.

Other standards for 19 inch wide embodiments of the rack 200 include: Electronic Industries Alliance EIA-310-D, "Cabinets, Racks, Panels, and Associated Equipment," dated September 1992. (Latest Standard Now REV E 1996); Consumer Electronics Association CEA-310-E "Design Requirements for Cabinets, Panels, Racks and Subracks," dated Dec. 14, 2005; and multiple standards from the International Electrotechnical Commission (IEC). Multiple documents from the IEC are available in French and English versions. Overall, one governing standard from the IEC is standard IEC 60297 "Mechanical structures for electronic equipment—Dimensions of mechanical structures of the 482.6 mm (19 inch) series." IEC 60297 is available at least as IEC 60297-1 replaced by IEC 60297-3-100; IEC 60297-2; replaced by IEC 60297-3-100; IEC 60297-3-100 Part 3-100: Basic dimensions of front panels, subracks, chassis, racks and cabinets; IEC 60297-3-101 Part 3-101: Subracks and associated plug-in units; IEC 60297-3-102 Part 3-102: Injector/extractor handle; IEC 60297-3-103 Part 3-103: Keying and alignment pin; IEC 60297-3-104 Part 3-104: Connector dependent interface dimensions of subracks and plug-in units; IEC 60297-3-105 Part 3-105: Dimensions and design aspects for 1U chassis; IEC 60297-4 Replaced by IEC 60297-3-102; and, IEC 60297-5 multiple documents, -100, 101, 102, . . . 107, replaced by IEC 60297-3-101.

Generally, embodiments of the rack unit or the rack 200 that are substantially in conformity with any industry-standard, such as one of the foregoing standards, may be considered as "compliant" with the respective standard.

With regards to a rack unit, the symbol "U" or "RU" is used to provide a unit of measure. The unit of measure describes the height of the rack unit that is designed to mount in a 19-inches wide rack 200 or a 23-inch wide rack 200. One rack unit is 1.75 inch (44.45 mm) high.

The size of a piece of rack-mounted equipment is frequently described as a number in "U." For example, a standard rack unit is often referred to as "1U," with taller rack units being multiples thereof. That is, a rack unit that is two times the height of the 1U rack unit is referred to as a "2U" and so on. Common rack units include rack units that are referred to as 1U, 2U, 3U, 4U, 5U, 6U and 7U rack units.

A typical full size rack 200 has a capacity of 42U. Accordingly, a typical full-size rack 200 holds just over six feet of equipment. A typical "half-height" storage rack 200 would be between about 18U to 22U, or around three feet high.

A front panel or filler panel in a rack is not an exact multiple of 1.75 inches (44.45 mm). To allow space between adjacent rack-mounted components, a panel is ⅟₃₂ inch (0.031 inch or 0.79 mm) less in height than the full number of rack units would imply. Thus, a 1U front panel would be 1.719 inches (43.66 mm) high. If N is the number of rack units, the formula for the panel height is H=(1.750 N−0.031) inch=(44.45 N−0.79) mm.

The height of the electronic modules is also standardized as multiples of 1.752 inches (44.50 mm) or one rack unit or U (less commonly RU). Over time, various standards have come to set the unit of "U" as 44.5 mm (15.9 mm+15.9 mm+12.7 mm), making each "U" officially 1.752 inches.

Note that the mounting-hole distance differs between a 19-inch wide rack 200 and a 23-inch wide rack 200. The 19-inch wide rack 200 uses uneven spacings (as shown in FIG. 2) while the 23-inch wide rack 200 uses evenly spaced mounting holes 230. It should be noted that although it is called a 19-inch rack unit, the actual mounting dimensions of a 19-inch rack unit are 18.19" inches (462 mm) wide, center to center.

Figure 3:
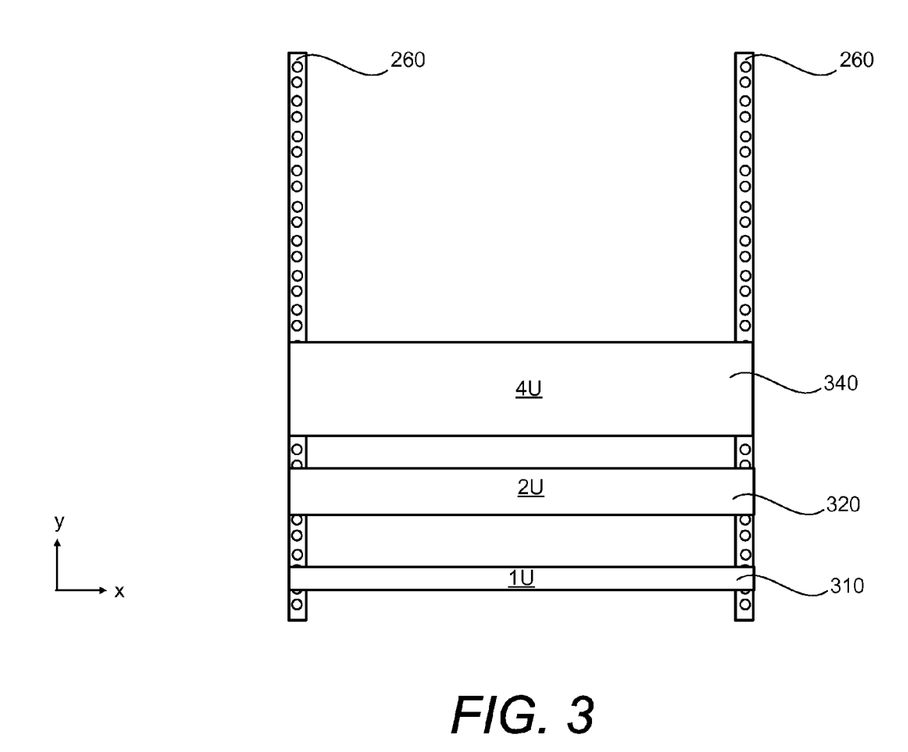
FIG. 3 is a partial view of a portion of the storage rack of FIG. 2, depicting different size rack units.

Referring now also to FIG. 3, aspects of an exemplary embodiment of the rack 200 are shown. In this example, the rack 200 includes three rack units mounted therein. The first rack unit shown is a 1U rack unit 310. The second rack unit shown is a 2U rack unit 320. The third rack unit shown is a 4U rack unit 340.

Figure 4:
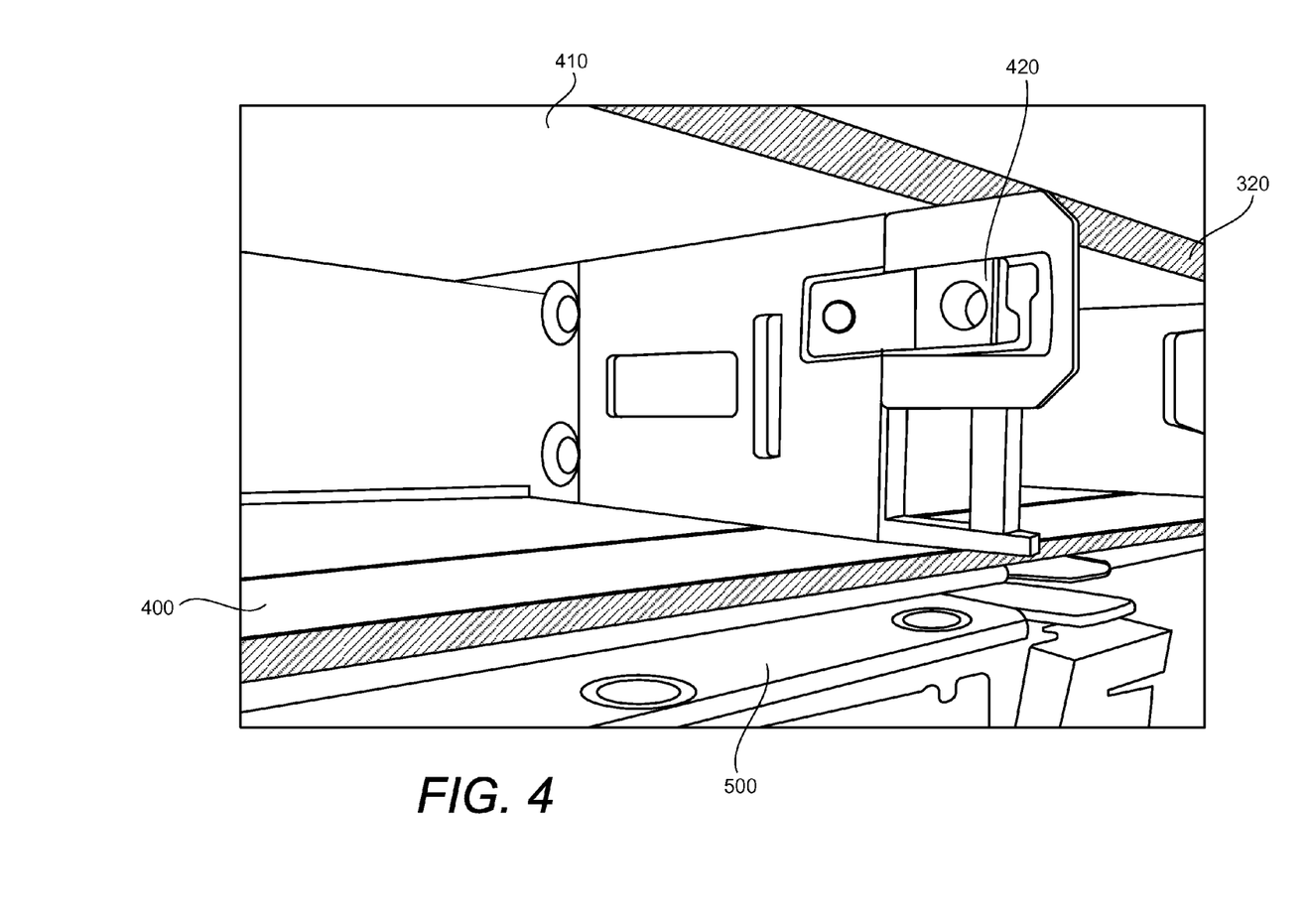
FIG. 4 is a perspective view of a portion of a 2U rack unit.

Referring now to FIG. 4, aspects of an exemplary embodiment of the 2U rack unit 320 are shown. In this illustration, a cutaway portion of the front of the 2U rack unit 320 is shown. Specifically, the illustration of FIG. 4 depicts a chassis 400. Generally, each rack unit includes an embodiment of the chassis 400. The chassis 400 includes at least one bay 410. In this example, the chassis 400 includes four (4) bays 410. That is, while the illustration is predominated by a single bay 410, it may be noted that there is another bay 410 next to the one depicted, both of which are disposed above other respective bays 410. A rearward portion of the bay 410 may include a plurality of connectors, interface devices, power devices and such, as are known in the art (not shown).

In the embodiment depicted in FIG. 4, the 2U rack unit 320 includes a retention element 420. In this example, the retention element 420 is a spring sheet. Generally, a spring sheet is disposed on each side (a left side and a right side) of the bay 410. Generally, the retention elements 420 provide for engaging and retaining a sled 500. As introduced with regards to FIG. 1, each sled 500 may accommodate at least a portion of an information handling system (IHS) 100, and may include a diversity of components.

Referring now to FIG. 5, aspects of a sled 500 are shown. Generally, each sled 500 is configured with dimensions to provide for a snug fit within a respective bay 410 of a given chassis 400.

Figure 5A:
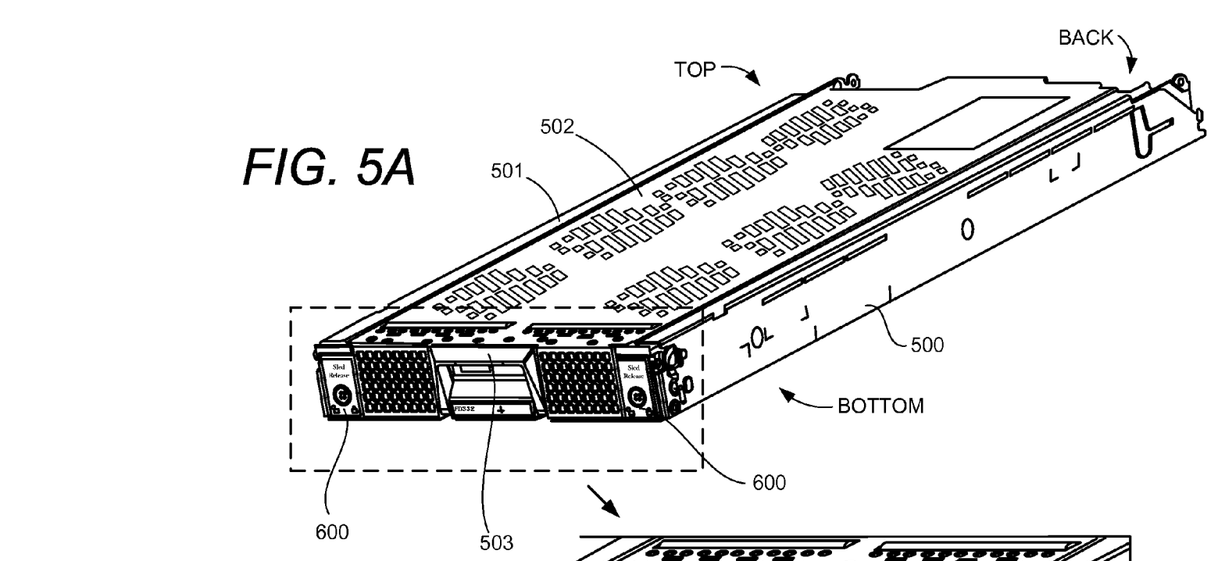
FIGS. 5A and 5B, collectively referred to herein as FIG. 5, depict aspects of a sled into which components of the information handling system of FIG. 1 are disposed.

As shown in FIG. 5A, the sled 500 provides a housing for the IHS 100. As a matter of convention, the sled 500 is characterized as having a top, a bottom, a back and a front. The orientations provided in FIG. 5A are arbitrary and merely for purposes of description. These are not to be construed as limiting of orientation for the sled 500. The sled 500 includes a sleeve 502 and a drawer 501. In this example, the sleeve 502 wraps around the sides and the bottom of the drawer 501. Together, the drawer 501 and the sleeve 502 may be referred to as the sled 500.

Figure 5B:
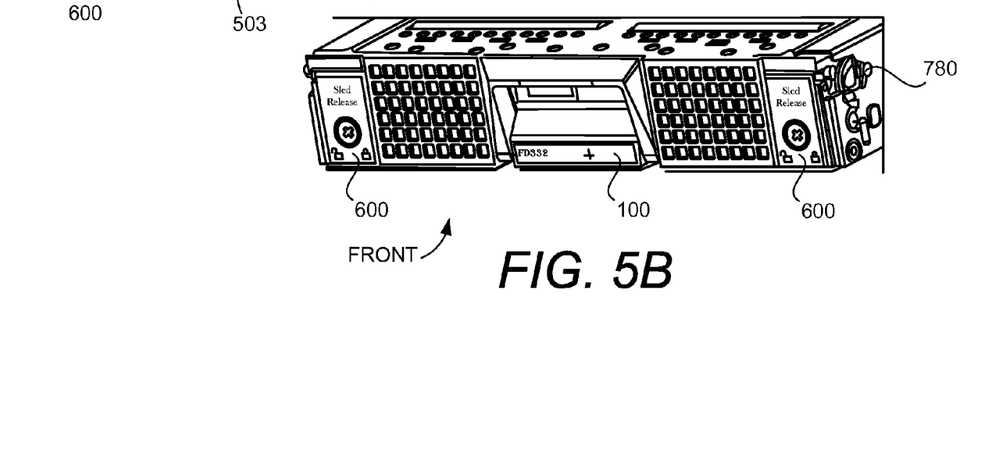

FIG. 5B provides an exploded view of the sled 500. That is, in the embodiment of FIG. 5B, it may be seen that the sled 500 includes two sled secure latches 600. In some embodiments, one sled secure latch 600 is deployed. In some other embodiments, additional sled secure latches 600 are used. Generally, the sled secure latch 600 provides for securing the drawer 501 within the sleeve 502, and further provides for securing the sled 500 within the chassis 400. As shown in FIG. 5B, the drawer 501 may further include a drawer handle 503, which is discussed in further detail below.

As described below in more detail, operation of a deadbolt provides for securing of the drawer 501 within the sleeve 502. Operation of an engagement element 780 in cooperation with a respective retention element 420 provides for securing the sled 500 within the chassis 400.

In this example, the engagement element 780 is referred to as a "standoff." Generally, each engagement element 780 is designed to engage a respective retention element 420 of the respective chassis 400. Aspects of the sled secure latch 600 are introduced in FIG. 6.

Figure 6:
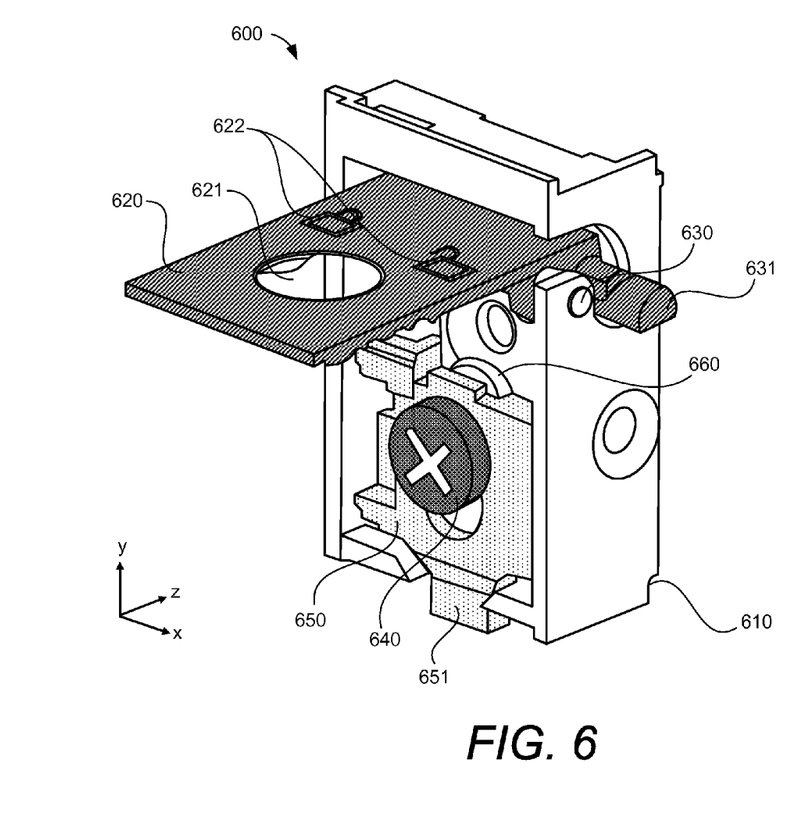
FIG. 6 is a perspective view of a sled secure latch for securing the sled drawer to the sled outer sleeve and for releasing the sled from the rack unit chassis latch.

Referring to FIG. 6, an illustrative embodiment of the sled secure latch 600 is shown. In this example, the sled secure latch 600 includes a body 610. In the example shown, the body 610 is configured for mounting to the front portion of the drawer 501. Generally, the body 610 serves to support other components within the sled secure latch 600 and to mount them to the drawer 501. Accordingly, the body 610 may include at least one throughway, such as a throughway with a counter sink for at least one screw.

Mounted to the body 610 is a pull handle 620. The pull handle 620 is fixed to the body 610 by a pin 630. Generally, the pin 630 provides for a hinge about which the pull handle 620 will rotate. As depicted in FIG. 6, the pull handle 620 is rotated into an open position. In some embodiments, such as the one depicted in FIG. 6, the pull handle 620 includes a window 621. The window 621 provides for observation of a lock status. That is, by peering through the window 621 of the pull handle 620, a user may ascertain whether the sled secure latch 600 is in a locked position or an unlocked position. More specifically, security button 640 is a button-like structure that provides a user manipulable control for locking and unlocking the sled secure latch 600. Security button 640 also provides an indicator 622 to display lock status. In the example shown, the user manipulable control includes an engagement feature such as a cross-slot pattern suited for a Phillips screwdriver. The engagement feature, in this instance the cross-slot pattern, includes an arrow which may be oriented to point in one direction or another. In operation, a user may simply insert a Phillips screwdriver through the window 621 of the pull handle 620. By turning the screwdriver and therefore the user manipulable control a quarter turn, the sled secure latch 600 may be locked or unlocked. When the pull handle 620 is closed, the optional indicator 622 will display locked or unlocked status. The combination of the user manipulable control and the indicator 622 on the pull handle 620 will quickly inform the user as to security status of the sled secure latch 600.

Note that the term "button-like structure" generally refers to a structure that may be fit within the body 610, and provides for the functionality described herein. The security button 640 need not be presented in the form of a "button," and may actually exhibit any structure deemed appropriate. Generally, the engagement feature of the button-like structure provides for engaging an external tool, such as a screwdriver that may be used by the user.

Other user-defined tools that may be suited for adjusting the security button 640 include, for example, a straight edge screwdriver, an Allen wrench, a Torx wrench or a similarly constructed specialty tool.

Turning of the user manipulable control will cause disk cam 660 to rotate. When the disk cam 660 rotates, slider 650 is pushed either upwardly or downwardly as the case may be. When the slider 650 is pushed downwardly, a deadbolt 651 of the slider 650 will engage a complimentary slot (not shown) that is in the sleeve 502. When the slider 650 is pushed upwardly, the deadbolt 651 of the slider 650 will be retracted from the complimentary slot in the sleeve 502, and the user may then withdraw the drawer 501 from the sleeve 502. Pulling of the drawer 501 from the sleeve 502 may be facilitated by use of the drawer handle 503.

Although the deadbolt 651 is shown as a conventional type of locking element with a rectangular profile (i.e., cross section), the deadbolt 651 may exhibit a variety of forms. For example, in another embodiment, the deadbolt 651 exhibits a cylindrical type of profile. In some other embodiments, the deadbolt 651 may include additional elements that are not shown. For example, the deadbolt 651 may include a plurality of insertable elements.

Figure 7A:
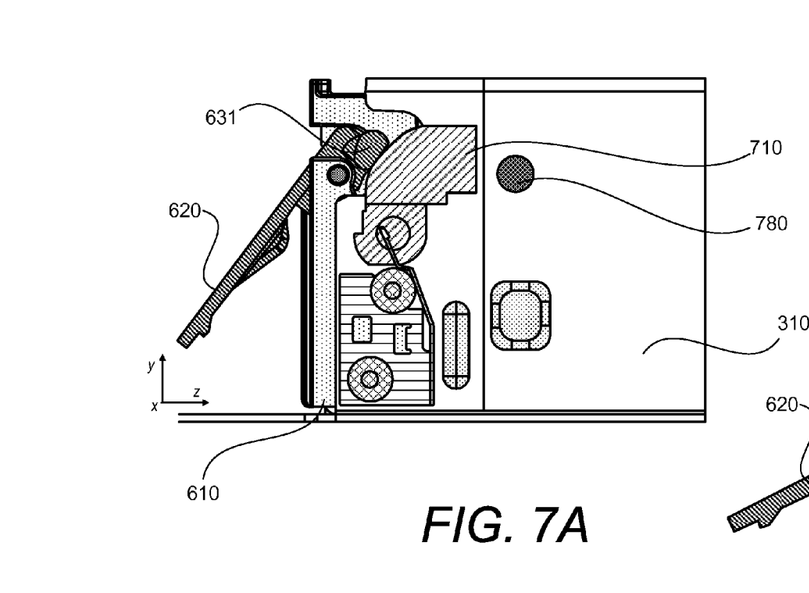
FIGS. 7A and 7B, collectively referred to herein as FIG. 7, are side views depicting operation of the sled secure latch of FIG. 6.
Figure 7B:
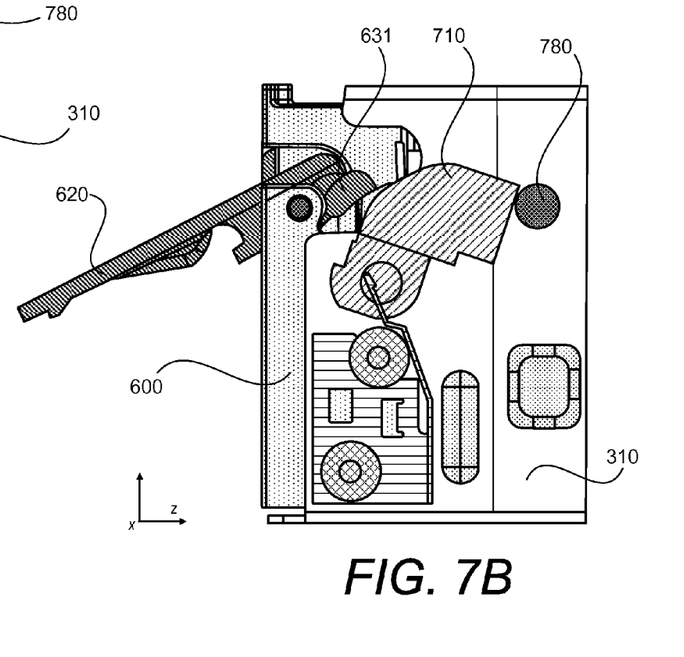

Refer now also to FIG. 7. In some embodiments, in order to withdraw the sled 500 from the chassis 400, the user may simply lift and use the pull handle 620 to pull the sled 500 out of the chassis 400. In some embodiments, rotating the pull handle 620 will adjust positioning of a flange 631. Generally, the flange 631 extends laterally from the pull handle 620 and will cause a flag 710 to rotate in a rearward direction. When the flag 710 rotates in the rearward direction, the rotation will cause the retention element 420 to disengage from engagement element 780. Accordingly, the user may easily slide the sled 500 from the chassis 400.

Figure 8:
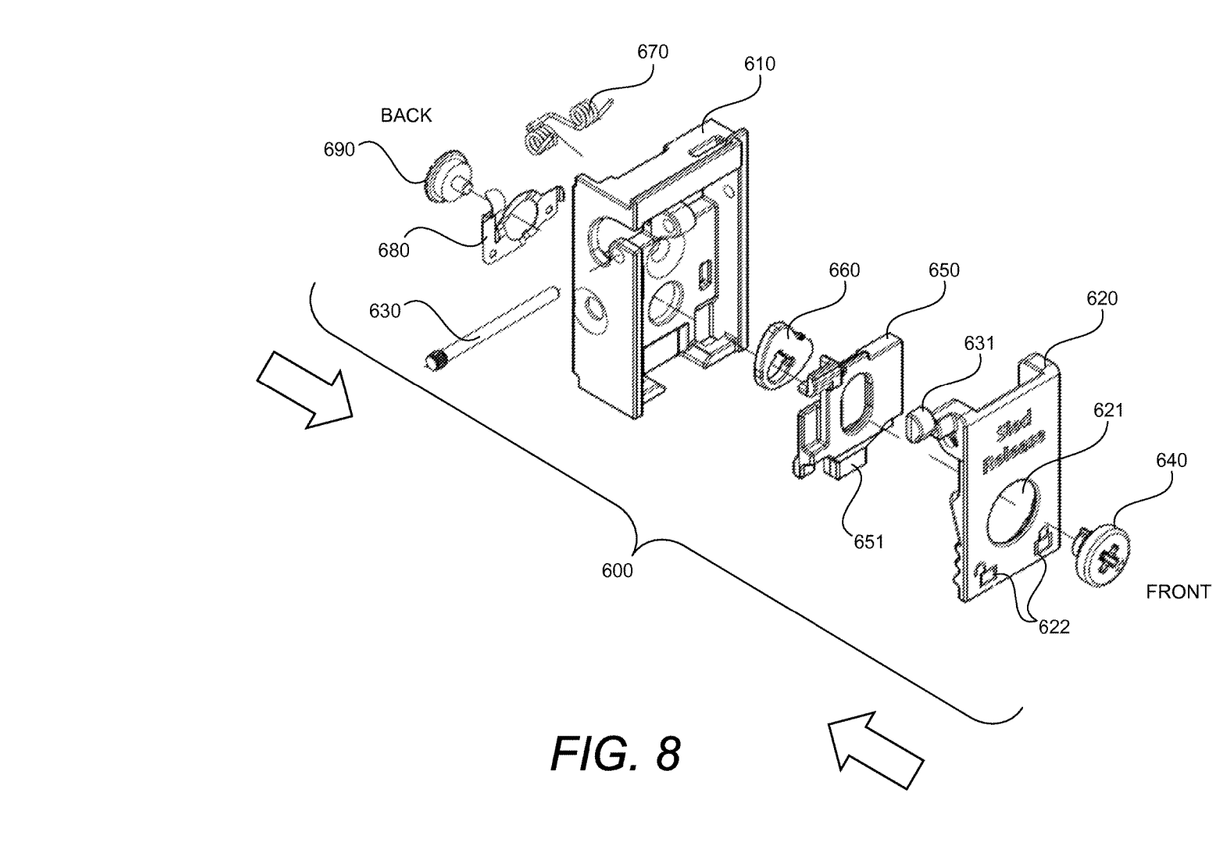
FIG. 8 is an exploded, front perspective view of an embodiment of the sled secure latch of FIG. 6.
Figure 9:
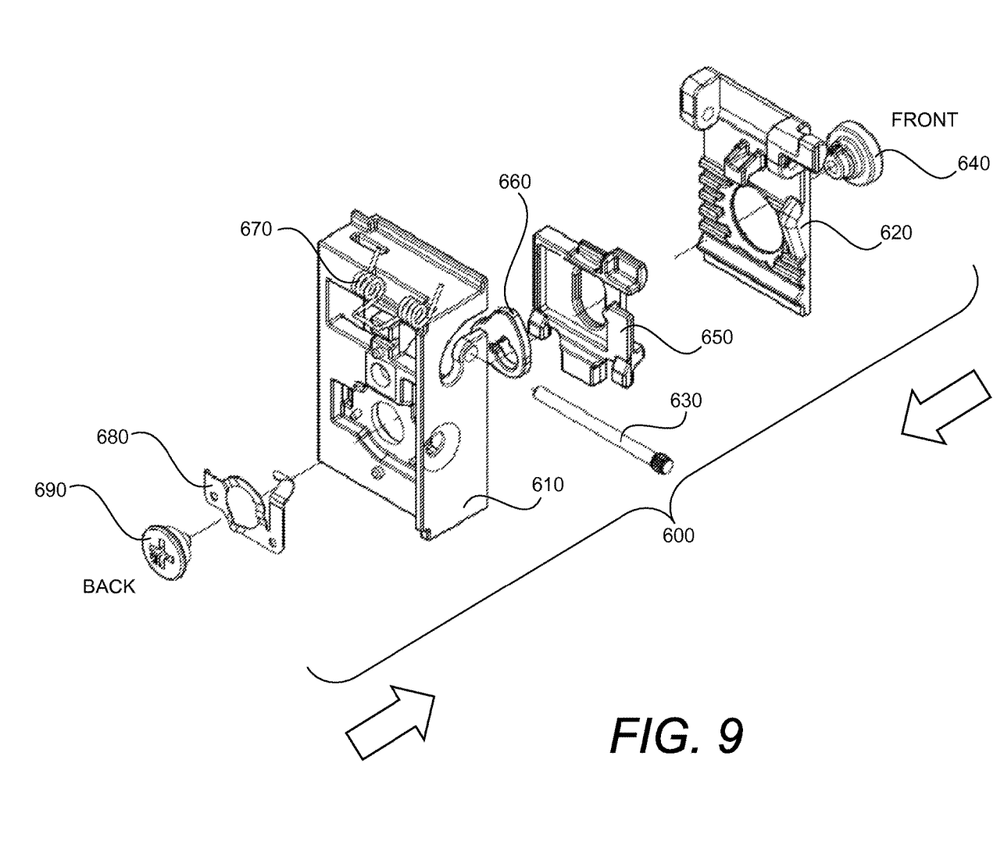
FIG. 9 is an exploded, rear perspective view of an embodiment of the sled secure latch of FIG. 6.

FIG. 8 and FIG. 9 provide exploded views of an embodiment of the sled secure latch 600. FIG. 8 provides an exploded view of the sled secure latch 600 from the front, while FIG. 9 provides an exploded view of the sled secure latch 600 from the back.

In the illustrated exemplary embodiment, sled secure latch 600 includes (generally from front to back): security button 640, pull handle 620, slider 650, cam disk 660, pin 630, body 610, spring 670, clip 680, and screw 690. In an exemplary embodiment, assembly includes placing the cam disk 660 within a back side of the slider 650. The combination of the slider 650 and cam disk 660 is then press fit into the body 610. Security button 640 is disposed through a central passageway in the slider 650. A key on security button 640 is fit into a keyway in the cam disk 660. While retaining the security button 640 in place, the clip 680 and screw 690 are disposed on the backside of the body 610. Screw 690 is turned to mate with the security button 640. The pull handle 620 is then disposed over the body 610, and spring 670 is mounted to the backside of the body 610. The pull handle 620 and spring 670 are then secured in place by insertion of the pin 630.

In some other embodiments, steps to assembly are varied. For example, in some embodiments, the pull handle 620 and spring 670 are mounted to the body 610 prior to assembly of the combination of slider 650 and cam disk 660.

Generally, spring 670 is configured for biasing the pull handle 620 into a closed (i.e, downward) position. Generally, the clip 680 is configured for providing a bias in a rearward direction, thus maintaining some friction between the slider 650 and the body 610, as well as maintaining alignment of the deadbolt 651 of the slider 650.

Components of the sled secure latch 600 may be fabricated from various materials. For example, some of the components in the sled secure latch 600 may be fabricated from plastic, while others are fabricated from metal. Various plastics and/or alloys may be used.

Figure 10:
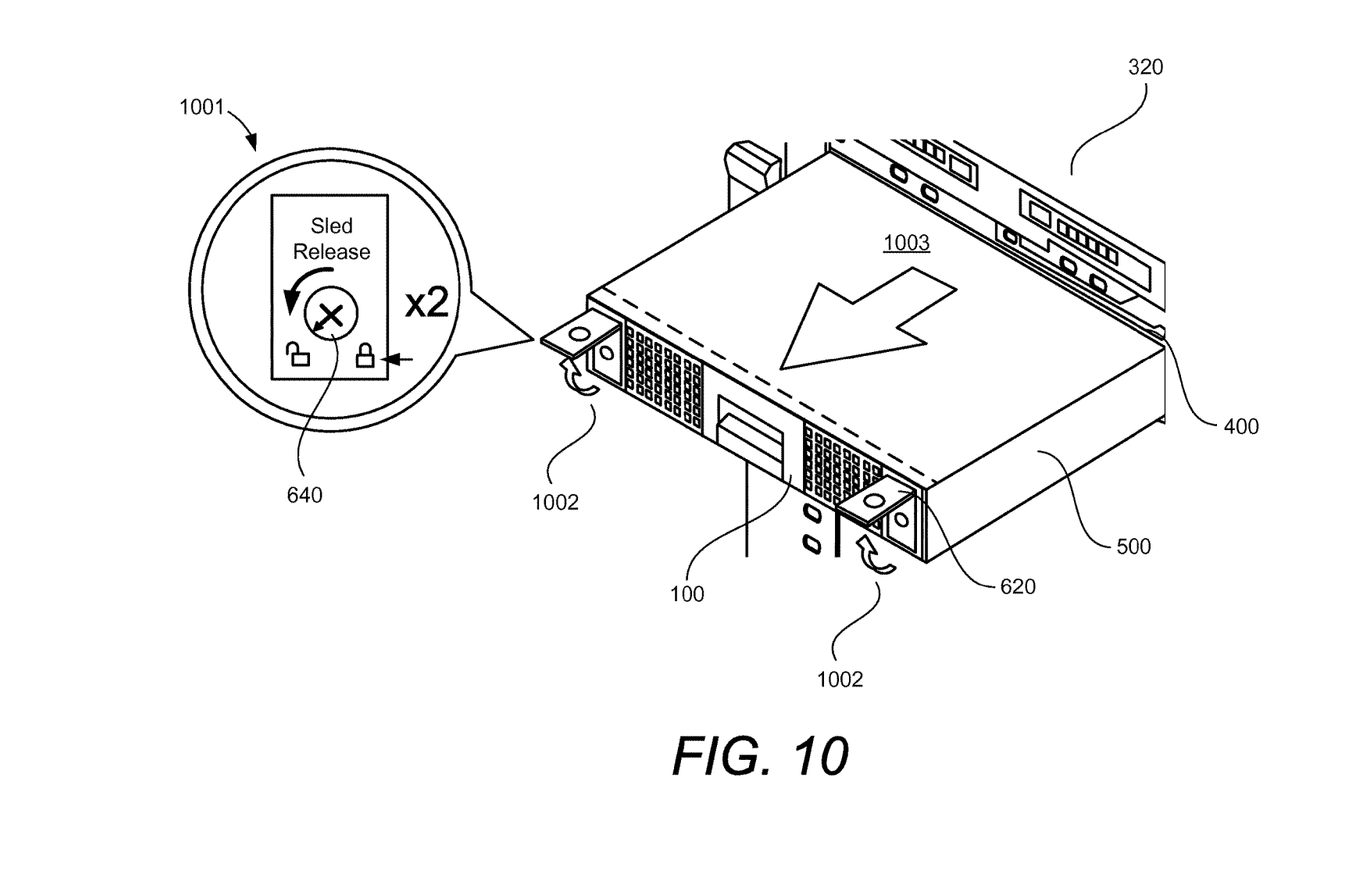
FIG. 10 is perspective illustration of the sled secure latch in use.

Referring now to FIG. 10, an overview of use of the sled secure latch 600 is shown. In a first step 1001, the security button 640 is turned counterclockwise to an unlocked position. In a second step 1002, the pull handle 620 is raised into an open position. In a third step 1003, the user pulls on the two pull handles 620 and withdraws the sled 500 from the chassis 400 of the 2U rack unit 320 depicted.

Having thus disclosed some introductory embodiments of the sled secure latch 600, some additional aspects and advantages are now presented.

Generally, the sled secure latch 600 provides a low-profile mechanism for securing a sled 500 containing information handling system (IHS) 100 within a rack 200. That is, the mechanism provided uses very little space within the respective rack unit, therefore providing system designers with volume useful for computing components. Additionally, the design is simple and intuitive for users. The pull handle 620 may be configured in a variety of ways to enhance ergonomics. In some embodiments, the pull handle 620 is color-coded to alert users to its presence and availability.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A latch for securing a compute sled into a chassis, the latch comprising:
    a body with a user manipulable control, the body being mountable to a drawer of the compute sled, the user manipulable control comprising a cam disk that adjusts a slider upwardly and downwardly according to rotation of the user manipulable control, and the cam disk rotates to cause the slider to one of engage and disengage a deadbolt with a sleeve that wraps around sides and bottom of the drawer, the latch further engages a retention element of the chassis; and
    a pull handle mounted to the body and fixed to the body by a pin that provides a hinge about which the pull handle rotates, wherein the pull handle facilitates pulling of the drawer from the sleeve when the deadbolt is disengaged from the sleeve,
    wherein rotating the pull handle adjusts positioning of a flange that extends laterally from the pull handle and causes a flag to rotate in a rearward direction, which causes the retention element to disengage from an engagement element.

2. The latch as in claim 1, wherein the user manipulable control comprises a button like structure comprising an engagement feature for engaging a user defined tool.

3. The latch as in claim 1, wherein the user manipulable control comprises a security button comprising a cross-slot pattern and an indicator that displays a lock status, the indicator comprising an arrow which is oriented to point in one direction or another between a locked and an unlocked position by turning of the security button.

4. The latch as in claim 3, wherein the pull handle comprises a window that enables observation of a lock status, wherein a user ascertains whether the latch is in a locked position or an unlocked position by peering through the window of the pull handle.

5. The latch as in claim 1, wherein the pull handle disengages the engagement element of the compute sled from the retention element of the chassis.

6. The latch as in claim 1, further comprising a spring for biasing the pull handle into a closed position.

7. The latch as in claim 1, further comprising a clip that provides friction between the slider and the body.

8. The latch as in claim 1, wherein the chassis is comprised within a rack unit.

9. The latch as in claim 8, wherein the rack unit mounts in a storage rack.

10. The latch of claim 1, further comprising a lock and unlock status indicator located on the pull handle, which in combination with the user manipulable control indicates a locked or unlocked security status of the deadbolt or latch when the pull handle is closed.

11. The latch of claim 1, wherein turning of the user manipulable control causes the disk cam to rotate, which pushes the slider either upwardly or downwardly to cause the deadbolt of the slider to engage the sleeve or to be retracted from the sleeve, wherein the drawer is capable of withdrawn from the sleeve when the deadbolt is retracted.

12. A method for assembling a latch for securing a compute sled into a chassis, the method comprising:
    selecting a body for maintaining a user manipulable control, the body being mountable to a drawer of the compute sled, the user manipulable control comprising a cam disk incorporated against the backside of a slider, the user manipulable control causes the slider to one of engage and disengage a deadbolt with a sleeve that wraps around sides and bottom of the drawer, where the latch further engages a retention element of the chassis; and installing the user manipulable control and the slider within the body;
    mounting a pull handle to the body and affixing the pull handle to the body by a pin that provides a hinge about which the pull handle rotates, wherein the pull handle facilitates pulling of the drawer from the sleeve when the deadbolt is disengaged from the sleeve, wherein rotating the pull handle adjusts positioning of a flange that extends laterally from the pull handle and causes a flag to rotate in a rearward direction, which causes the retention element to disengage from an engagement element.

13. The method as in claim 12, further comprising mounting the pull handle to the body with the pin.

14. The method as in claim 13, further comprising incorporating a spring that biases the pull handle into a closed position.

15. The method as in claim 12, further comprising incorporating a clip that causes friction between the slider and the body.

16. The method as in claim 12, further comprising securing the user manipulable control and the slider with a screw.

17. An information handling system (IHS) comprising:
    a compute sled that mounts within a chassis of a rack unit, the sled comprising at least one component of the IHS disposed therein; and
    a latch that secures the compute sled into the chassis, the latch comprising a body with a user manipulable control, the body providing mounting to a drawer of the compute sled, the user manipulable control comprising a cam disk that adjusts a slider upwardly and downwardly according to rotation of the user manipulable control, and the cam disk rotates to cause the slider to engage and disengage a deadbolt with a sleeve that wraps around sides and bottom of the drawer, the latch further configured for engaging a retention element of the chassis, and the latch further comprising a pull handle mounted to the body and fixed to the body by a pin that provides a hinge about which the pull handle rotates, wherein the pull handle facilitates pulling of the drawer from the sleeve when the deadbolt is disengaged from the sleeve, wherein rotating the pull handle adjusts positioning of a flange that extends laterally from the pull handle and causes a flag to rotate in a rearward direction, which causes the retention element to disengage from an engagement element.

18. The information handling system (IHS) as in claim 17, further comprising an instrumentality operable system to at least one of compute, classify, process, transmit, receive, retrieve, originate, switch, store, display, manifest, detect, record, reproduce, handle, and use data.

* * * * *